(12) United States Patent
Foos et al.

(10) Patent No.: US 11,451,189 B1
(45) Date of Patent: Sep. 20, 2022

(54) METHOD FOR IMPROVING MECHANICAL INTEGRITY OF CRYSTALLINE SILICON SOLAR CELLS

(71) Applicant: The United States of America As Represented by the Secretary of the Navy, Indian Head, MD (US)

(72) Inventors: Edward E. Foos, Alexandria, VA (US); Richard Jason Jouet, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 26 days.

(21) Appl. No.: 15/932,203

(22) Filed: Feb. 16, 2018

(51) Int. Cl.
| | | |
|---|---|---|
| *H01L 31/00* | (2006.01) |
| *H02S 30/00* | (2014.01) |
| *H01L 31/0216* | (2014.01) |
| *H01L 31/18* | (2006.01) |
| *H01L 31/0224* | (2006.01) |

(52) U.S. Cl.
CPC .......... *H02S 30/00* (2013.01); *H01L 31/0216* (2013.01); *H01L 31/022433* (2013.01); *H01L 31/1804* (2013.01)

(58) Field of Classification Search
CPC ......... H01L 31/0216; H01L 31/022433; H01L 31/1804
See application file for complete search history.

(56) References Cited

U.S. PATENT DOCUMENTS

| | | | |
|---|---|---|---|
| 8,293,624 B2 | 10/2012 | Romano et al. |
| 8,900,659 B2 | 12/2014 | Zeng et al. |
| 8,932,898 B2 | 1/2015 | Christoforo et al. |
| 8,962,131 B2 | 2/2015 | Zou et al. |
| 9,312,426 B2 | 4/2016 | Gambino et al. |
| 9,608,221 B2 | 3/2017 | Park et al. |
| 2011/0312163 A1* | 12/2011 | Romano ................ B82Y 10/00 438/478 |
| 2012/0196053 A1* | 8/2012 | Coull ....................... H01B 1/02 427/600 |
| 2013/0146335 A1* | 6/2013 | Gambino ............ H01L 31/1884 174/251 |

* cited by examiner

*Primary Examiner* — Mounir S Amer
*Assistant Examiner* — Alexander Belousov
(74) *Attorney, Agent, or Firm* — Fredric J. Zimmerman

(57) ABSTRACT

The method of the present invention improves mechanical integrity of a crystalline silicon solar cell having an exposed layer of n-type silicon. A solution of electrically-conductive nanowires in an inert liquid is sprayed onto the exposed layer in order to form a grid pattern of the nanowires on the exposed layer after the inert liquid dries or evaporates.

16 Claims, 1 Drawing Sheet

METHOD FOR IMPROVING MECHANICAL INTEGRITY OF CRYSTALLINE SILICON SOLAR CELLS

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to crystalline silicon solar cells, and more particularly to a method for improving the mechanical integrity of these solar cells.

BACKGROUND OF THE INVENTION

Crystalline silicon solar cells currently represent one of the highest efficiency technologies commercially available for portable power requirements. These cells combine a high level of performance with a moderate cost, making them desirable for use in energy harvesting applications. However, a disadvantage of crystalline silicon solar cells is their susceptibility to damage from cracking due to transport or use in a field environment. While other cell technologies are more tolerant in terms of mechanical damage (e.g., amorphous silicon), they have much lower power conversion efficiencies thereby limiting their use for certain applications. Thus, improving the mechanical integrity of crystalline silicon solar cells is of significant commercial interest. However, effective mechanical integrity improvements need to be achieved with lightweight and cost-effective processes and apparatus.

SUMMARY OF THE INVENTION

Accordingly, it is an object of the present invention to provide a method for improving the mechanical integrity of crystalline silicon solar cells.

Other objects and advantages of the present invention will become more obvious hereinafter in the specification and drawings.

In accordance with the present invention, a method is provided for improving mechanical integrity of a crystalline silicon solar cell having an exposed layer of n-type silicon. A solution of electrically-conductive nanowires in an inert liquid is sprayed onto the exposed layer. Spray step(s) are employed to form a grid pattern of the nanowires on the exposed layer after the inert liquid dries or evaporates.

BRIEF DESCRIPTION OF THE DRAWINGS

Other objects, features and advantages of the present invention will become apparent upon reference to the following description of the exemplary embodiments and to the drawings, wherein corresponding reference characters indicate corresponding parts throughout the several views of the drawings and wherein.

DETAILED DESCRIPTION OF THE INVENTION

Figure 1:
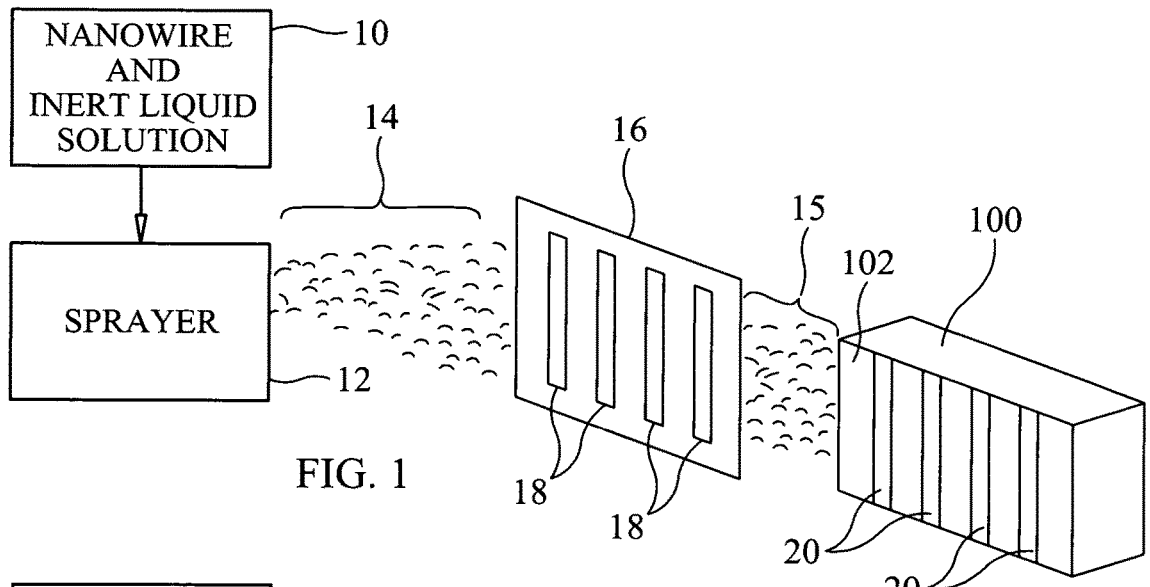
FIG. 1 is a schematic view of a first spray step in the process for improving the mechanical integrity of a crystalline silicon solar cell in accordance with an embodiment of the present invention.
Figure 2:
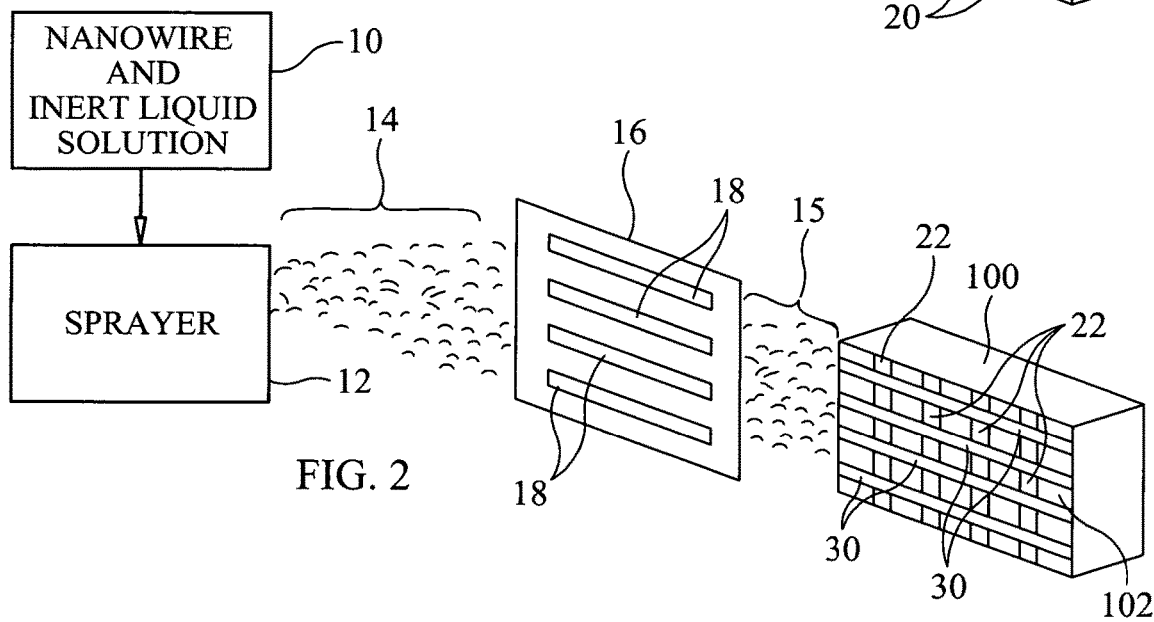
FIG. 2 is a schematic view of a second spray step in the process for improving the mechanical integrity of a crystalline silicon solar cell in accordance with an exemplary embodiment of the present invention.

Referring now to the drawings and more particularly to FIGS. 1 and 2, a schematic view is shown of an exemplary apparatus for carrying out a two-spray-step process for improving mechanical integrity of a crystalline silicon solar cell 100 in accordance with an embodiment of the present invention. As is known in the art, crystalline silicon solar cells have an exposed layer of n-doped or n-type silicon with the exposed layer being referenced in FIG. 1 by numeral 102.

The apparatus needed to carry out the method of the present invention includes a solution 10 of electrically-conductive nanowires mixed in an inert liquid, a sprayer 12 for converting solution 10 to a small-droplet spray 14 of solution 10, and a spray mask 16 having a plurality of elongated and parallel slots 18 cut through mask 16. The realization of solution 10 and sprayer 12 may be achieved with a variety of systems such as, but not limited to, aerosol container/sprayers, air brush spray systems, pneumatic paint systems, etc. Spray mask 16 is any conventional masking device/material with the number, size, and configuration of slots 18 being chosen to satisfy the needs of a particular application.

Solution 10 includes a fast-drying or fast-evaporating (i.e., in air at ambient room temperature) liquid that is inert with respect to the nanowires mixed therein and inert with respect to exposed layer 102. Suitable inert liquids include ethanol, methanol, isopropanol, and acetone. Suitable electrically-conductive nanowires mixed in solution 10 may include silver, gold, copper, aluminum, and platinum. For purposes of cost and commercial availability, solution 10 may be silver nanowires mixed in liquid ethanol. By way of an illustrative example, a suitable formulation of solution 10 is about 1 milligram of silver nanowires per milliliter of liquid ethanol.

In accordance with the present invention, spray mask 16 is positioned adjacent to exposed layer 102 of solar cell 100. That is, spray mask 16 may be spaced-apart from exposed layer 102 or placed directly on exposed layer 102 without departing from the scope of the present invention. Sprayer 12 directs solution 10 as spray 14 to impinge on spray mask 16 as shown. As a result, portions 15 of spray 14 pass through slots 18 and impinge on exposed surface 102 in the form of parallel regions 20 of solution 10. Since the inert liquid portion of solution 10 is fast-drying or fast-evaporating, the inert liquid portion of solution 10 evaporates from parallel regions 20 leaving corresponding parallel regions 22 of the solution's nanowires as shown in FIG. 2. Note that the fast-drying or fast-evaporating nature of the inert liquid portion of solution 10 allows exposed surface 102 to be positioned vertically (i.e., aligned with the force of gravity), horizontally (i.e., perpendicular to the force of gravity), or at any angle between vertical and horizontal without departing from the scope of the present invention. Drying/evaporation may occur passively in an ambient room temperature environment, or in a slightly-elevated temperature environment without departing from the scope of the present invention.

Figure 3:
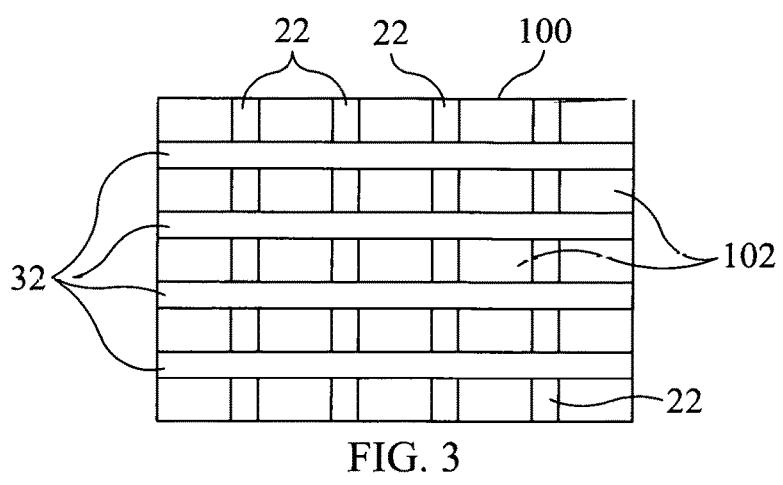
FIG. 3 is a plan view of a crystalline silicon solar cell with a grid pattern of conductive material disposed thereon following the two spraying steps in accordance with an embodiment of the present invention.

Following the formation of parallel regions 22 of nanowires as shown in FIG. 2, spray mask 16 is repositioned adjacent to exposed layer 102 such that the mask's parallel slots 18 are at a non-zero angle (alpha) up to and including 90° with respect to parallel regions 22 as shown in FIG. 2. By way of example in the illustrated embodiment, spray mask 16 is rotated in its plane through an angle of 90°. Sprayer 12 is again operated to direct solution 10 as spray 14 to impinge on spray mask 16 such that portions 15 of spray 14 pass through repositioned slots 18 and impinge on portions of parallel regions 22 and exposed surface 102 in the form of parallel regions 30 of solution 10. Following drying/evaporation of the inert liquid from parallel regions 30 leaving corresponding parallel regions 32 of the nanowires as shown in FIG. 3. More specifically, parallel regions 32 are adhered to the portions of parallel regions 22 crossed by parallel regions 32 and exposed layer 102 as shown in FIG. 3.

The resulting grid of nanowires (e.g., parallel regions 22 and 32) adhered to exposed surface 102 to form a flexible structural support for exposed layer 102. A general thickness of the grid of nanowires (i.e., measured perpendicular to exposed layer 102) is on the order of about 100 nanometers to about 2 microns. The relatively thin thickness of the grid of nanowires has a negligible weight impact on the solar cell and allows them to be transparent to incoming light thereby having minimal impact in solar energy absorption by the solar cell. The solution-based deposition method is simple and inexpensive to implement. Because the grid pattern is flexible and electrically conductive, the grid pattern may provide electrical conductivity across the exposed layer of n-type silicon even if cracks develop in the exposed layer.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should be at least construed in light of the number of significant digits and by applying ordinary rounding.

What is claimed is:

1. A method of improving mechanical integrity of crystalline silicon solar cells, comprising:
   providing a crystalline silicon solar cell having an exposed layer of n-type silicon;
   providing a solution of nanowires in an inert liquid, said nanowires being made from a single, electrically-conductive material; and
   spraying said solution onto said exposed layer at ambient, room temperature for forming a grid pattern of said nanowires on said exposed layer,
     wherein said spraying said solution comprises:
   providing a mask having a plurality of parallel slots cut there through;
   positioning said mask adjacent to said exposed layer;
   said spraying said solution onto said mask, wherein said solution passes through said parallel slots to impinge on said exposed layer and define first parallel regions of said solution on said exposed layer, wherein corresponding first parallel regions of said nanowires adhere to said exposed layer following evaporation of said inert liquid from said first parallel regions of said solution;
   repositioning said mask adjacent to said exposed layer, wherein said parallel slots are at an angle α with respect to said first parallel regions of said nanowires, and wherein said angle α satisfies $0° < α ≤ 90°$; and
   said spraying said solution onto said mask, wherein said solution passes through said parallel slots to impinge on portions of said first parallel regions of said nanowires and said exposed layer to define second parallel regions of said solution overlaid on said portions of said first parallel regions of said nanowires and said exposed layer, and wherein corresponding second parallel regions of said nanowires adhere to said portions of said first parallel regions of said nanowires and said exposed layer following evaporation of said inert liquid from said second parallel regions of said solution.

2. The method according to claim 1, wherein said electrically-conductive material is said single, electrically-conductive material selected from the group consisting of silver, gold, copper, aluminum, and platinum.

3. The method according to claim 1, wherein said inert liquid is selected from the group consisting of ethanol, methanol, iso-propanol, and acetone.

4. The method according to claim 1, wherein said spraying includes the step of drying said solution on said exposed layer.

5. The method according to claim 1, wherein said nanowires comprise silver nanowires, and wherein said inert liquid comprises ethanol.

6. The method according to claim 5, wherein said solution comprises about 1 milligram of said silver nanowires per milliliter of said ethanol.

7. The method according to claim 1, wherein a thickness of said grid pattern of said nanowires is in a range of about 100 nanometers to about 2 microns.

8. A method of improving mechanical integrity of crystalline silicon solar cells, comprising:
   providing a crystalline silicon solar cell including an exposed layer of n-type silicon;
   providing a solution of nanowires in an inert liquid, said nanowires made from a, single electrically-conductive material;
   spraying a pattern of said solution onto said exposed layer at ambient room temperature; and
   evaporating said inert liquid from said solution on said exposed layer, wherein a pattern of said nanowires adheres to said exposed layer in correspondence to said pattern of said solution,
     wherein said spraying and said evaporating comprises:
   providing a mask having a plurality of parallel slots cut there through;
   positioning said mask adjacent to said exposed layer;
   firstly said spraying said solution onto said mask, wherein said solution passes through said parallel slots to impinge on said exposed layer and define first parallel regions of said solution on said exposed layer;
   firstly evaporating said inert liquid from said first parallel regions of said solution, wherein corresponding first parallel regions of said nanowires adhere to said exposed layer;
   repositioning said mask adjacent to said exposed layer wherein said parallel slots are at an angle α with respect to said first parallel regions, and wherein said angle α satisfies $0° < α ≤ 90°$;

secondly said spraying said solution onto said mask, wherein said solution passes through said parallel slots to impinge on portions of said first parallel regions of said nanowires and said exposed layer to define second parallel regions of said solution overlaid on said portions of said first parallel regions of said nanowires and said exposed layer; and secondly evaporating said inert liquid from said second parallel regions of said solution, wherein corresponding second parallel regions of said nanowires adhere to said portions of said first parallel regions of said nanowires and said exposed layer.

9. The method according to claim 8, wherein said single, electrically-conductive material is selected from the group consisting of silver, gold, copper, aluminum, and platinum.

10. The method according to claim 8, wherein said inert liquid is selected from the group consisting of ethanol, methanol, iso-propanol, and acetone.

11. The method according to claim 8, wherein said nanowires comprise silver nanowires, and wherein said inert liquid comprises ethanol.

12. The method according to claim 11, wherein said solution comprises about 1 milligram of said silver nanowires per milliliter of said ethanol.

13. The method according to claim 8, wherein a thickness of said pattern of said nanowires is in a range of about 100 nanometers to about 2 microns.

14. A method of improving mechanical integrity of crystalline silicon solar cells, comprising providing a crystalline silicon solar cell including an exposed layer of n-type silicon;

providing a solution of silver nanowires mixed with liquid ethanol;

providing a mask having a plurality of parallel slots cut there through;

positioning said mask adjacent to said exposed layer;

spraying said solution onto said mask, wherein said solution passes through said parallel slots to impinge on said exposed layer and define first parallel regions of said solution on said exposed layer, wherein corresponding first parallel regions of said silver nanowires adhere to said exposed layer following evaporation of said liquid ethanol from said first parallel regions of said solution;

repositioning said mask adjacent to said exposed layer wherein said parallel slots are at an angle $\alpha$ with respect to said first parallel regions, and wherein said angle $\alpha$ satisfies $0°<\alpha\leq 90°$; and spraying said solution onto said mask, wherein said solution passes through said parallel slots to impinge on portions of said first parallel regions of said silver nanowires and said exposed layer to define second parallel regions of said solution overlaid on said portions of said first parallel regions of said silver nanowires and said exposed layer, wherein corresponding second parallel regions of said silver nanowires adhere to said portions of said first parallel regions of said silver nanowires and said exposed layer following evaporation of said liquid ethanol from said second parallel regions of said solution wherein a grid pattern of said silver nanowires is adhered to said exposed layer.

15. The method according to claim 14, wherein said solution comprises about 1 milligram of said silver nanowires per milliliter of said liquid ethanol.

16. The method according to claim 14, wherein a thickness of said grid pattern of said silver nanowires is in a range of about 100 nanometers to about 2 microns.

\* \* \* \* \*